United States Patent
Stoeffl

(10) Patent No.: US 6,177,794 B1
(45) Date of Patent: Jan. 23, 2001

(54) USE OF EARTH FIELD SPIN ECHO NMR TO SEARCH FOR LIQUID MINERALS

(75) Inventor: Wolfgang Stoeffl, Livermore, CA (US)

(73) Assignee: The Regents of the University of California, Oakland, CA (US)

(*) Notice: Under 35 U.S.C. 154(b), the term of this patent shall be extended for 0 days.

(21) Appl. No.: 09/078,593

(22) Filed: May 13, 1998

Related U.S. Application Data

(60) Provisional application No. 60/046,365, filed on May 13, 1997.

(51) Int. Cl.[7] .................................................. G01V 3/00
(52) U.S. Cl. .................................................. 324/303
(58) Field of Search .................................................. 324/303

(56) References Cited

U.S. PATENT DOCUMENTS

| | | | |
|---|---|---|---|
| 2,561,489 | 7/1951 | Baoch et al. | 175/183 |
| 2,999,203 | 9/1961 | Brown | 324/0.5 |
| 2,999,204 | 9/1961 | Jones et al. | 324/0.5 |
| 3,019,363 | 1/1962 | Wiechering | 313/93 |
| 3,199,022 | 8/1965 | Brown et al. | 324/0.5 |
| 3,234,454 | 2/1966 | Collins | 324/0.5 |
| 3,268,800 | 8/1966 | Hoehn et al. | 324/0.5 |
| 3,439,260 | * 4/1969 | Bene | 324/303 |
| 3,483,465 | 12/1969 | Baker, Jr. | 324/0.5 |
| 3,597,681 | 8/1971 | Huckabay et al. | 324/0.5 R |
| 3,667,035 | * 5/1972 | Slichter | 324/303 |
| 3,723,856 | 3/1973 | Brown | 324/0.5 G |
| 3,775,671 | 11/1973 | Brown | 324/0.5 R |
| 4,528,508 | 7/1985 | Vail, III | 324/303 |
| 4,537,067 | * 8/1985 | Sharp et al. | 73/151 |
| 4,629,986 | 12/1986 | Clow et al. | 324/303 |
| 4,646,016 | 2/1987 | Brown | 324/303 |
| 4,646,017 | 2/1987 | Brown | 324/303 |
| 4,646,018 | 2/1987 | Brown | 324/303 |
| 4,646,019 | 2/1987 | Brown | 324/303 |
| 4,646,020 | 2/1987 | Brown | 324/303 |
| 4,646,021 | 2/1987 | Brown | 324/303 |
| 4,646,022 | 2/1987 | Brown | 324/303 |
| 4,717,876 | 1/1988 | Masi et al. | 324/303 |

(List continued on next page.)

FOREIGN PATENT DOCUMENTS 2 198 540    5/1986   (GB) .

* cited by examiner

*Primary Examiner*—Christine K. Oda
*Assistant Examiner*—Dixomara Vargas
(74) *Attorney, Agent, or Firm*—Alan H. Thompson

(57) ABSTRACT

An instrument for measuring the spatial, qualitative and quantitative parameters of an underground nuclear magnetic resonance (NMR) active liquid mineral deposit, including oil and water. A phased array of excitation and receiver antennas on the surface and/or in a borehole excites the NMR active nuclei in the deposit, and using known techniques from magnetic resonance imaging (MRI), the spatial and quantitative distribution of the deposit can be measured. A surface array may utilize, for example, four large (50–500 diameter) diameter wire loops laid on the ground surface, and a weak (1.5–2.5 kHz) alternating current (AC) field applied, matching the NMR frequency of hydrogen in the rather flat and uniform earth magnetic field. For a short duration (a few seconds) an additional gradient field can be generated, superimposed to the earth field, by applying direct current (DC) to the grid (wire loops), enhancing the position sensitivity of the spin-echo and also suppressing large surface water signals by shifting them to a different frequency. The surface coil excitation can be combined with downhole receivers, which are much more radio-quiet compared to surface receivers, and this combination also enhances the position resolution of the MRI significantly. A downhole receiver module, for example, may have a 5.5 inch diameter and fit in a standard six inch borehole having a one-quarter inch thick stainless steel casing. The receiver module may include more than one receiver units for improved penetration and better position resolution.

22 Claims, 4 Drawing Sheets

U.S. PATENT DOCUMENTS

| | | | |
|---|---|---|---|
| 4,724,385 | 2/1988 | Vail, III | 324/303 |
| 4,792,757 | 12/1988 | Vail, III | 324/303 |
| 4,804,918 | 2/1989 | Vail, III | 324/303 |
| 4,820,983 | 4/1989 | Bondall et al. | 324/307 |
| 4,933,638 | 6/1990 | Kleinberg et al. | 324/303 |
| 4,939,460 | 7/1990 | Patla et al. | 324/303 |
| 4,947,119 | 8/1990 | Ugurbil et al. | 324/307 |
| 4,987,368 | 1/1991 | Vinegar | 324/303 |
| 4,988,947 | 1/1991 | Ugurbil | 324/307 |
| 5,019,784 | 5/1991 | Garwood et al. | 324/307 |
| 5,055,787 | 10/1991 | Kleinberg et al. | 324/303 |
| 5,055,788 | 10/1991 | Kleinberg et al. | 324/303 |
| 5,189,371 | 2/1993 | Conolly et al. | 324/309 |
| 5,291,137 | 3/1994 | Freedman | 324/303 |
| 5,309,098 | 5/1994 | Coates et al. | 324/303 |
| 5,497,087 | 3/1996 | Vinegar et al. | 324/303 |
| 5,498,960 | 3/1996 | Vinegar | 324/303 |
| 5,596,274 | 1/1997 | Sezginer | 324/303 |
| 5,892,361 * | 4/1999 | Meyer, Jr. et al. | 324/338 |
| 6,018,243 * | 1/2000 | Taicher et al. | 324/303 |

RF ENVELOPE SIGNAL

TIME DOMAIN

FREQUENCY DOMAIN

USE OF EARTH FIELD SPIN ECHO NMR TO SEARCH FOR LIQUID MINERALS

RELATED APPLICATION

This application relates to U.S. Provisional application Ser. No. 60/046,365 filed May 13, 1997 and claims priority thereof.

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to locating underground deposits, particularly to underground NMR active liquid mineral deposits, and more particularly to an instrument using earth field spin echo NMR for measuring the spatial, qualitative and quantitative parameters of an underground NMR active liquid mineral deposits, such as oil and water.

Various systems and instruments have been developed over the years for searching underground areas for minerals, oil, and water. For example, oil companies are in an active search to expand the borehole diagnostics to more than a meter beyond the borehole liner in an effort to reduce the number of production wells and improve extraction efficiency. The following patents exemplify these prior efforts: U.S. Pat. Nos. 2,999,203 issued Sep. 5, 1961; No. 3,234,454 issued Feb. 8, 1966; U.S. Pat. No. 3,597,681 issued Aug. 3, 1971; No. 4,528,508 issued Jul. 9, 1985; U.S. Pat. No. 4,646,021 issued Feb. 24, 1987; No. 4,724,385 issued Feb. 9, 1988; U.S. Pat. No. 4,792,757 issued Dec. 20, 1988; No. 4,804,918 issued Feb. 14, 1989; U.S. Pat. No. 4,933,638 issued Jun. 12, 1990; No. 4,987,368 issued Jan. 22, 1991; U.S. Pat. No. 4,988,947 issued Jan. 21, 1991; and No. 5,291,137. Also, see United Kingdom Application GB-2 198 540 filed Dec. 3, 1986. The oil reservoir topology is often very complicated, and there is a need to develop new technologies having spatial and material resolution to expand oil mapping up to 50 or even 100 meters from the borehole.

One of the prior technologies utilized to analyze oil sediments is high-field laboratory nuclear magnetic resonance (NMR), and high-field NMR probes have been utilized for downhole exploration close to the borehole. NMR was usually carried out with high magnetic fields upward of 500 Gauss to improve the signal strength from small samples.

It has been discovered that with proper hardware, as provided by the present invention, NMR can be used at low magnetic fields, but large samples are needed. Oil deposits, for example, provide a very large sample. It is impossible to create a flat magnetic field at a one-sided large distance from a coil system. Maxwell's equations do not allow such a configuration. There are a few magnet configurations to create a small close-distance flat field. Nature provides such a flat magnetic field, the earth magnetic field itself being at about 500 milli-Gauss. The related proton NMR frequency is about 2000 Hz. The field is very low by NMR standards and the natural relaxation times of protons in small pores comes close to the NMR frequency. The short relaxation time makes the Fast Fourier Transform (FFT) signal very wide. If the pore size of the rock gets extremely small (relaxation time of less than 1 ms), the signal will be lost. The low NMR frequency of protons in the earth magnetic field allows for great penetration depth of the AC driver or excitation field and the returned signal from the spinning protons. In dry rock, a useful penetration depth is 1 km, while in salt saturated wet rock, it is reduced to about 200 meters due to the limiting skin depth of conductive material. Dry salt has a reasonably low conductivity, and thus the penetration would be greater.

By the use of large diameter wire loop arrays positioned on the ground surface, and when a weak (1.5–2.5 kHz) AC field is applied, matching the NMR frequency of hydrogen in the rather flat and uniform earth magnetic field, a phased array of transmitter and receiver loops is provided, and which suppress radio and power line interference, whereby a liquid mineral deposit, oil or water, can be spatially, qualitatively, and quantitatively measured utilizing earth field spin echo NMR and magnetic resonance imaging (MRI) techniques. Also, the surface coil phased array may be combined with downhole receivers which enhance the position resolution of an MRI significantly. Mapping of areas surrounding a borehole is done by changing the excitation strength and duration of the individual driver (excitation) coils.

SUMMARY OF THE INVENTION

It is an object of the present invention to measure underground liquid mineral deposits.

A further object of the invention is to use earth field spin echo NMR to search for oil.

Another object of the invention is to provide an instrument for measuring the spatial, qualitative, and quantitative parameters of an underground NMR active liquid mineral deposit, such as oil and water.

Another object of the invention is to provide a phased array of excitation and receiver antennas on the earth surface and/or in a borehole, which excites the NMR active nuclei in a liquid mineral deposit, and using known techniques from MRI to measure their spatial and quantitative distribution.

Another object of the invention is to provide an instrument which utilizes earth field spin echo NMR for use in tomography of underground water distribution, in mapping potential contamination sites, for oil and ground water exploration, and oil mapping around existing boreholes.

Other objects and advantages of the present invention will become apparent from the following description and accompanying drawings. Basically the invention involves the use of earth field spin echo NMR to search for liquid metal deposits, such as oil and water. An instrument is provided for measuring the spatial, qualitative and quantitative parameters of an underground NMR active liquid mineral deposit. The instrument utilizes a phased array of excitation and receiver antennas on the surface and/or in boreholes which excites the NMR active nuclei in the liquid mineral deposit, and by using known techniques from MRI, the spatial and quantitative distribution of the deposit can be measured. The instrument has many applications including oil mapping around existing boreholes, oil and ground water exploration, tomography of underground water distribution, and mapping of potential contamination sites.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The invention is directed to the use of earth field spin echo (NMR) for measuring liquid mineral deposits. The invention utilizes an instrument comprising a phased array of excitation and receiver antennas on the ground surface and/or in a borehole which excites the NMR active nuclei in the liquid mineral deposit, and using known techniques from magnetic resonance imaging (MRI). This invention involves the combination of commercially available excitation coils and magnetic field sensors with recently developed and commercially available Time Dependent Fast Fourier Transform analysis of very long time sequences.

As pointed out above, the low NMR frequency of protons in the earth magnetic field allows for great penetration depth (1 km) of the alternating current (AC) driver or excitation field and the return signal from the spinning protons, provided the soil is dry and porous, while in soil involving constructive material, such as salt saturated wet rock, the penetration is significantly less (200 meters) due to the limiting skin depth of conductive material. Thus, in downhole measuring, where the borehole is lined with a stainless steel casing, for example, which is a conductive material, the penetration is less (20–50 meters) due to the skin-effect.

Earth field NMR works only with liquids, such as water or oil, in not-too-fine pores, because the permanent stray field from atoms and molecules embedded in solids is larger than the earth field itself, wiping out any NMR signal in a solid. In a liquid, the molecules change their orientation at a high enough frequency (100 GHz) to average out the neighbor atomic stray field. The related proton NMR frequency is about 2000 Hz.

In the low earth magnetic field (500 milli-Gauss) and at room temperature, the polarization of the proton population is only about one in a few billion. In medical MRI, it is about one in 500,000. Only the small polarized fraction of the protons give a signal. All others cancel their signal completely. Luckily, there are about $10^{29}$ protons in a ton of oil, enough to give a signal even at low field.

The earth magnetic field is very uniform. Over large areas, rock chemistry cannot alter the earth field, since the total flux penetrating the surface has to be conserved. On a very local scale, the rock chemistry can change the earth field by small amounts. These changes are usually much smaller compared to the relative broad NMR resonance in the earth field. The short spin relaxation times of hydrogen (typically 1–300 ms) will broaden the NMR line from 1% to over 10% of its base frequency.

Figure 1:
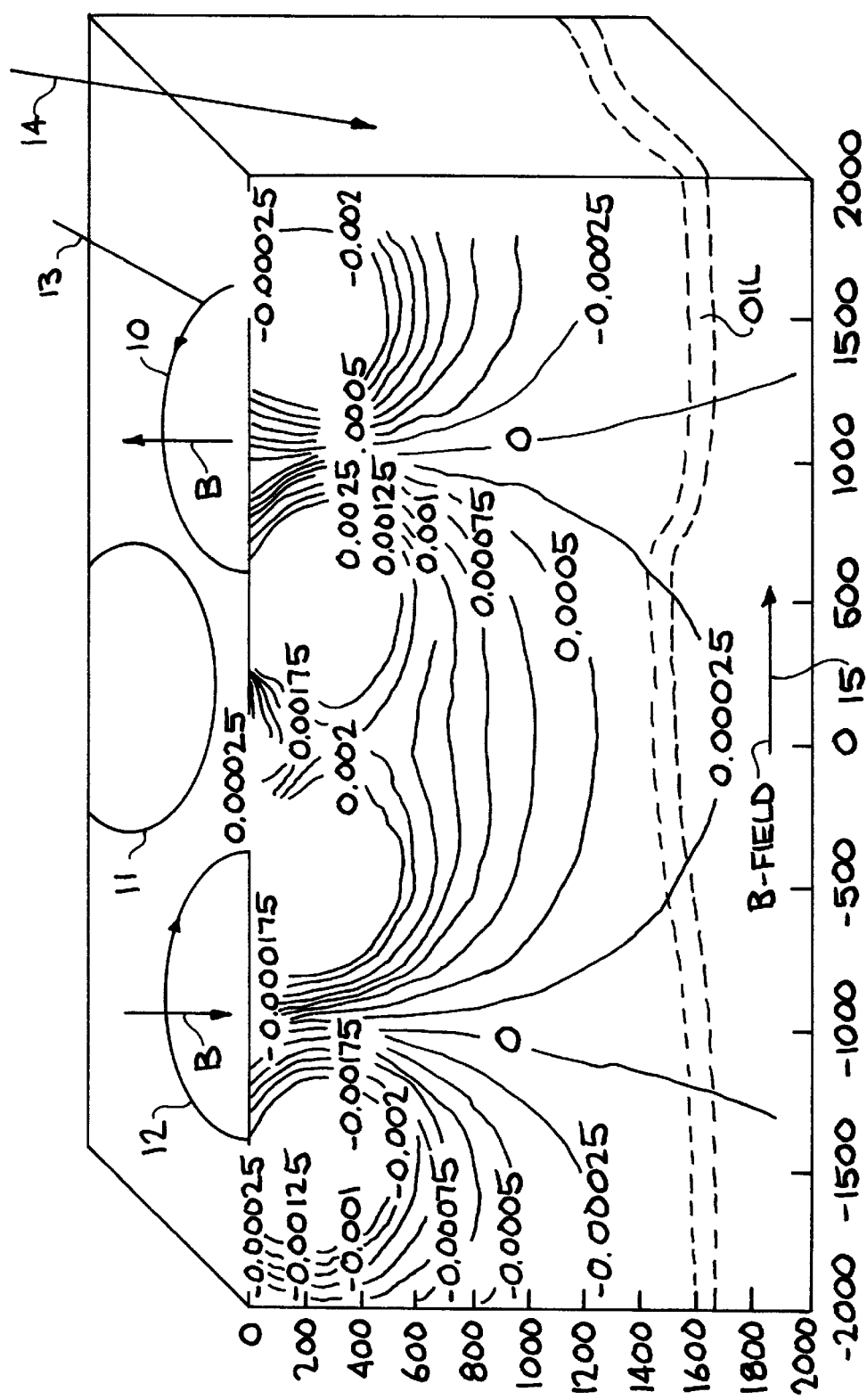
FIG. 1 is a partial cross-sectional view of an underground magnetic field profile utilizing a phased array of excitational and receiver antennas or wire loops laid on the ground surface, in accordance with the present invention.
Figure 2:
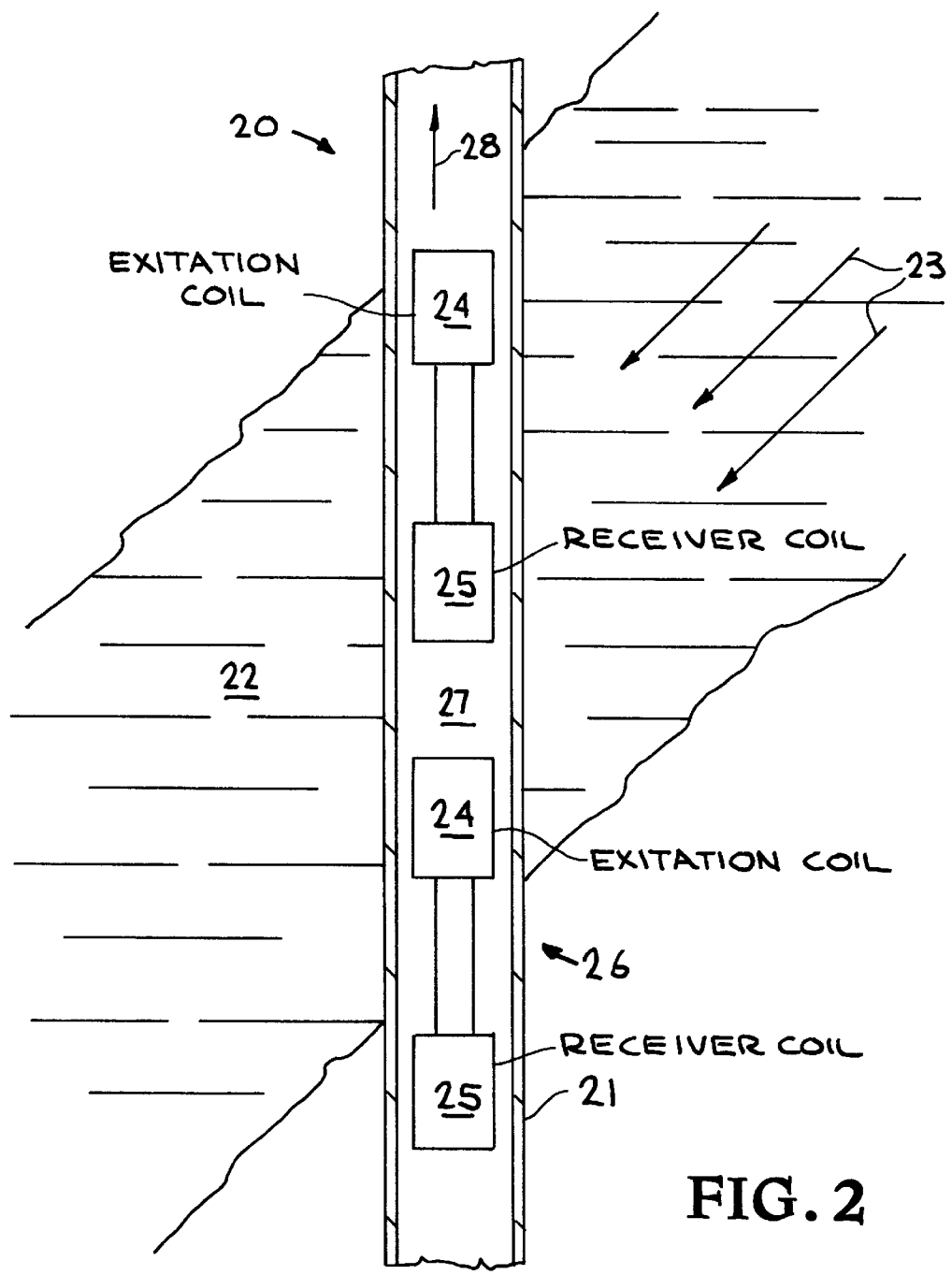
FIG. 2 is a partial, cut-away, view of an underground or borehole instrument for measuring and mapping the area around a borehole in accordance with the present invention.

The present invention involves the use of earth field spin echo NMR utilizing an instrument involving a surface array to obtain an underground magnetic field profile down to over 1 km, such as illustrated in FIG. 1, and/or an underground or borehole instrument, such as illustrated in FIG. 2 to map an area (20–50 meters) beyond the borehole liner. Each of the surface array and borehole instruments are described hereinafter individually and can be utilized in combination.

The Surface Array Instrument

Large 50 to 500 meter diameter wire coils or loops such as loops 10, 11, 12 illustrated in FIG. 1 (3 of 4 loops shown), are laid on the ground surface, and a weak (1.5 to 2.5 kHz) AC field is applied, as indicated by arrow 13 (1000 ampere AC current at 2000 Hz), matching the NMR frequency of hydrogen in a rather flat and uniform earth magnetic field (about 500 milli-Gauss) indicated by arrow 14. Using the phased array transmitter loops 10 and 12 and receiver loops 11 (only one shown), one can suppress radio and power line interference quite well. The earth field is mapped with three-dimension (3D) magnetometers. To measure the position of the coils or loops and field mapping instruments, one can use differential Global Positioning System (GPS) or visual survey methods. For a short duration (a few seconds), one can generate an additional gradient field, not shown, superimposed to the earth field, by applying direct current (DC) to the grid, enhancing the position sensitivity of the spin-echo and also suppressing large surface water signal by shifting them to a different frequency. As shown in FIG. 1 by arrows B in loops 10 and 12, there is a 200 milli-Gauss field in the center of each of these loops, and a B-field indicated by arrow 15. This B-field vector rotates perpendicular to the earth magnetic field at about 2000 Hz. The phased array, as exemplified in FIG. 1, illustrates that 0.25 milli-Gauss flips the proton spins by 90 degrees in 0.2 seconds, with a spin relaxation time of one to several hundred milli-seconds. Very low resistivity ground below the phased array can distort the signal. During driver excitation, the receiver coils or loops must be short-circuited to prevent damage to the receivers.

It is possible to be sensitive to a great depth with a large enough array; for example, half a mile. The low-frequency long-wave radio signals can penetrate earth and water. There is some attenuation of the signal by conductive water saturated rock and sediments. This will make the analysis about as complicated as the unfolding of acoustic data. Pulsed time domain and DC ground conductivity data can help to interpret the NMR data. Fully saturated salt water with a conductivity of up to 2 ohmmeter will limit the search depth to about 100–200 meter.

The transmitter coils or loops are powered by a commercially available high current, variable frequency power unit. A typical current will be around 1000 ampere at 2 kHz in a single or multiple turn loop. The receiver coil can be the same loop as the driver coil. The signal quality will be better if a multi turn coax cable is used as the receiver coils. The geometry of the receiver coils may be the same as the driver coil or it can be arranged in a different pattern to make the best use of the local earth magnetic field inclination.

Most of the 2 kHz background noise, which can mask the NMR signal, comes from local power lines. There is a general background from the plasma waves generated in the polar auroras; they vary in intensity depending on the solar activity. To suppress the background noise, we will use a phased array and use receiver coils away from the driver coil to measure the phase related background signal and subtract it from the NMR signal.

To extract position information from the receiver signal, we use the phase relation between the driver and receiver signal, the strength and direction of the received signal in relation to the varying driver coil strength. With a phased array of four or more driver and receiver coils, a multitude of signal combinations are possible. Practically all standard MRI pulse sequences are possible. We will also use the T1 and T2 NMR relaxation time constants to extract material information from the signal.

It can be possible to detect the 5000 times weaker signal, compared to hydrogen, from carbon-13 in oil directly, making it possible to detect (liquid) oil from the surface or in the vicinity of a borehole. Carbon bound in solid like coal does not give a measurable signal in the weak earth magnetic field. The carbon frequency is only about 500 Hz, allowing for twice the penetration depth compared to hydrogen.

The surface coil excitation can be combined with downhole receivers described hereinafter. Downhole receivers are much more radio-quiet compared to surface receivers. In addition, only the transmitting signal has to overcome the shielding skin effect of the conductive ground; the NMR signal is measured locally. The combination of surface transmitters and downhole receivers also provides enhancing of the position resolution of MRI significantly.

The Downhole Instrument

Currently, there is no technology capable of looking beyond a few meters around a borehole with any significant spatial and material resolution. There is great interest from the oil industry in oil mapping up to 50 or even 100 meters around the borehole. Such mapping will allow for greater extraction efficiency and fewer production wells. The oil reservoir topology is often very complicated.

Earth field NMR and MRI technology can be used inside a non-conductive lined borehole and provide a deep material specific penetration map. At great depth, the surface coil transmitter signal is shielded by the skin effect. One can generate the driver or excitation field locally inside the borehole. A long solenoid (e.g. 20 meters), such as illustrated in FIG. 2, placed in segments in a borehole, can create an AC magnetic field of one milli-Gauss out to a distance of 50 meters. This field is strong enough to produce a 90 degree spin flip in protons in about 50 ms. The field of the coil can be boosted by a core of Mu-metal. By applying different currents to the coil segments and adding a DC component, one can do standard MRI of the vicinity.

The receiver coil of the downhole instrument, such as shown in FIG. 2, is a classical low frequency antenna; many turns (e.g. 50,000) are wound along a long (10 meters) Mu-metal core to pick up the small signal from the spinning hydrogen nuclei. Commercially available borehole receiver antennas can see a 2 kHz AC-field as low as $10^{-13}$ Gauss. With several receiver coils at different heights one can identify the location of the excited nuclei. Directional sensitivity can be achieved by winding 2 more vertical and crossed coils around the Mu-metal cores. A better approach is to use individual receiver coils for each of the three directions.

Mapping of the surrounding area is done by changing the excitation strength and duration of the individual driver coils. The position sensitivity can be enhanced by adding a DC field to the driver coils during excitation, thereby eliminating the excitation of nearly protons. Like in the surface array coil instrument, the receiver coils have to be short-circuited during the driver excitation to prevent damage to the sensitive receiver electronics.

FIG. 2 illustrates a section of an embodiment of a downhole NMR instrument. The instrument as shown in FIG. 2 and generally indicated at 20 is located in a borehole 21 which extends through an oil reservoir 22, with a 0.5 Gauss earth field, indicated by arrows 23, passing therethrough. The instrument 20 includes, for example, a 1.5 to 2.5 kHz AC and DC excitation coil generally indicated at 24, which may be a 5.5 inch diameter copper coil, several meters (e.g. 10) in length, and with a 100,000 ampere-winding per meter on a Mu-metal core. A receiver module with coil and electronics is generally indicated at 25, which for example, may be cooled to liquid nitrogen (LN2) and use high temperature Superconducting Quantum Interference Devices (HI-SQUIDs), the pickup coil having a one to several meters length with 50,000 turns on a Mu-metal core. An optional second set comprising a driver coil 24 and a receiver module 25 is shown at 26 for improved penetration and much better position resolution, and reversed DC polarity gives vertical resolution. There is a separation or space indicated at 27 between the sets of coils, which, for example, is about a coil length. The borehole 21 may be a 6 inch borehole with a ¼ inch wall thickness steel casing, for example. The driver and receiver coils are connected by cables to the surface, as indicated by arrow 28.

Figure 3:
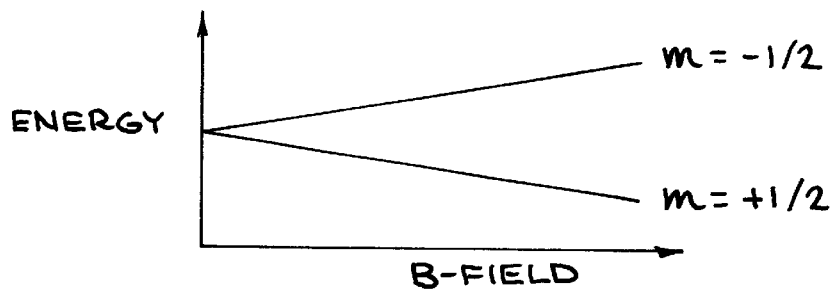
FIG. 3 graphically illustrates the magnetic moment of a proton.

FIG. 3 graphically illustrates the magnetic moment of a proton. The nuclear Zeeman effect splits a spin (m) to ½ nuclear level (m=-½, m=+½), within energy difference $\Delta E = \mu_i B_0 \cos(\mu_i B_0)$. The nuclear spin can orient itself parallel or anti-parallel to the magnetic field (B-field). The unit for $\mu_i$ is the nuclear magneton, $\mu_n$, and thus:

$$\mu n = \frac{e_0 \cdot h}{4\pi \cdot m_0} = 5.05 \cdot 10^{-27} J/T$$

For hydrogen, the energy difference is $\Delta E\ 10^{-11}$ eV at 1 Gauss. NMR is a weak effect and usually requires a strong magnet to be sensitive to small samples. Luckily there are some $10^{29}$ protons in a ton of oil.

The polarization depends on the magnetic field. There is only a small energy difference between upper nuclear ($N_{up}$) and lower nuclear ($N_{low}$) spin states. At room temperature, both levels are populated nearly equally, whereby:

$$N_{up}/N_{low} = exp(-\Delta E/kT) = exp(-2\mu_i B_0/kT),$$

where k =Boltzmann constant, T =temperature in Kelvin, B =magnetic field in Tesla, and $\mu$=magnetic moment. For the earth magnetic field, the polarization is only on in a few billion, while in medical MRI, it is about one in 500,000. Only the small polarized fraction gives the NMR signal; and again, luckily, there are some $10^{29}$ protons in a ton of oil.

Figure 4:
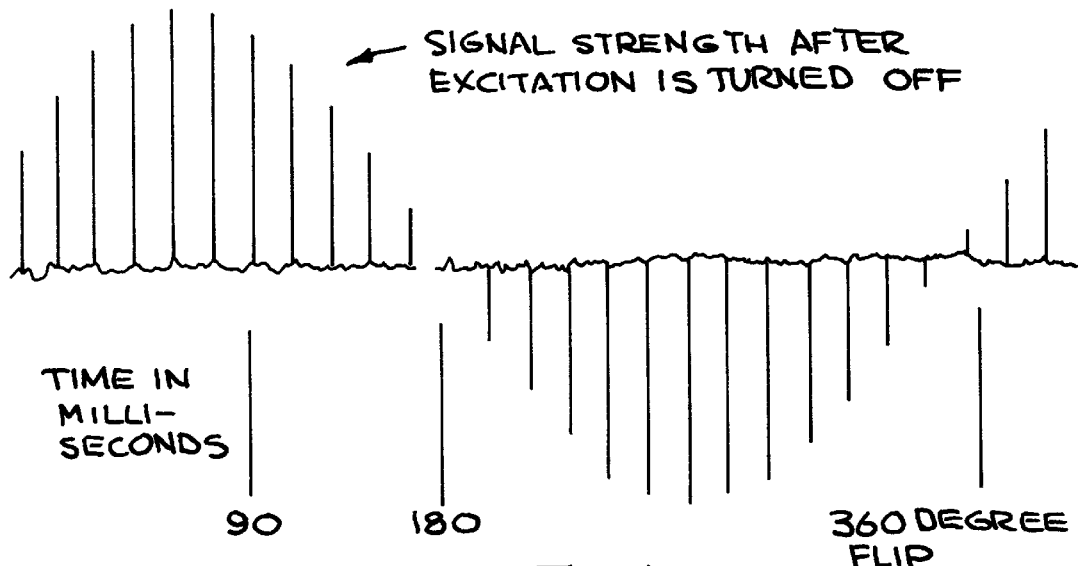
FIG. 4 illustrates the influence of an excitation pulse length on the resulting spin-echo signal.

A measurable signal is created by a weak oscillating magnetic field perpendicular to the main B-field which turns the spin. FIG. 4 illustrates the influence of the excitation pulse length on the resulting spin-echo signal. There is a long pause between measurement to allow the spins to thermalize again and reach equilibrium. The angle-determining factor is the product (RF B-field·exposure time). A 90 degree flip maximizes the signal, while a 180 degree flip inverts the population, but no signal results.

Figure 5:
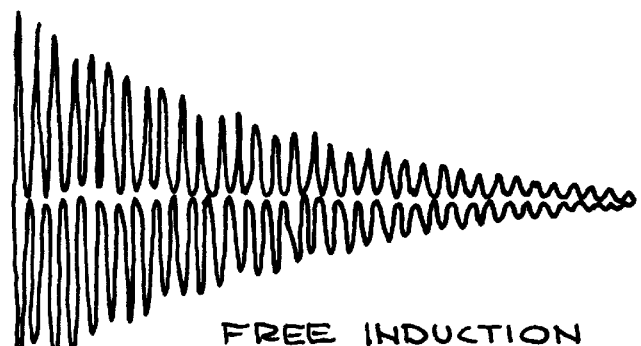
FIG. 5 illustrates a free induction decay signal.
Figure 6:
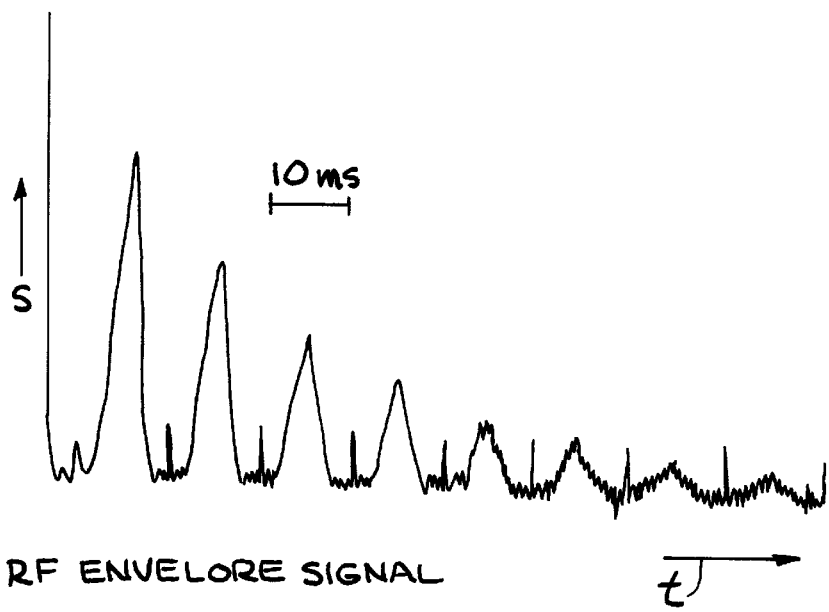
FIG. 6 illustrates an RF envelope signal after successive 180 degree pulses.

Spin relaxation time measurement is illustrated in FIGS. 5 and 6. The spin—spin coupling between neighboring nuclei slowly realigns the proton spin with the main magnetic field. After a 90 degree pulse, the signal slowly disappears with a time constant $T_2$. This is called the free induction decay (FID) or transversal relation. FIG. 5 illustrates a free induction decay signal. The longitudinal relaxation time, $T_1$, is the time it takes to repopulate the lower quantum state after a 180 degree pulse is applied, causing a full population inversion. This is called the spin-lattice or longitudinal relation. FIG. 6 illustrates the radio frequency (RF) envelope signal after successive 180 degree pulses. The peaks appear when the spins are back in phase.

Figure 7:
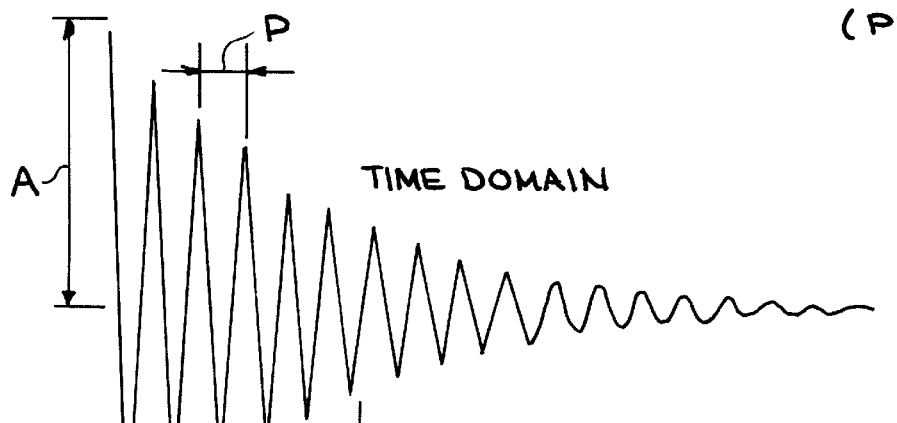
FIG. 7 graphically illustrates the relationships between time and frequency domains.
Figure 7:
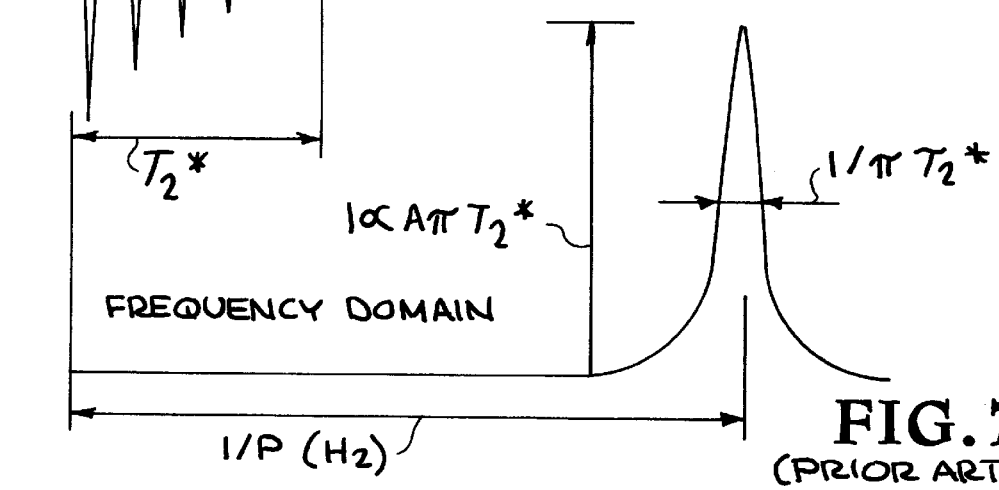

The Fast Fourier Transform (FFT) creates a power vs. frequency spectrum. FIG. 7 illustrates relationships between time and frequency domains. The period, P, of the free induction decay (FID) gives the position of the line. The rate of decay, $T^*_2$, gives the linewidth; and the initial amplitude, A, gives the line its area and, therefore, its intensity proportional to $A \cdot \pi T^*_2$.

As pointed out above, earth field NMR with solid samples is currently considered to be hopeless. Each nucleus creates its own magnetic field. A proton creates a field of 2 Gauss for its neighbors. In a liquid, the molecules scatter at about $10^{11}$ Hz. They completely randomize the localized fields and average their combined field to zero. In a solid, the molecules stay put and create a non-uniform field in their surrounding. The NMR signal will be about 10–100 kHz wide. In a small pore liquid, the hydrogen still sees the fixed field from the solid. The relaxation time becomes sensitive to the pore size. One can spin a sample at high speed in the laboratory, at the magic angle, 54°44', to the B-field to cancel the dipolar interactions. This makes solid state earth field NMR useless, since we cannot spin the earth at 50,000 RPM. Thus, only liquids like water or hydrocarbons (oil), or gas can be currently measured with earth field NMR.

The key to this invention is the combination of commercially available excitation coils and magnetic field sensors with recently developed and commercially available Time Dependent Fast Fourier Transform analysis of very long time sequences.

The main limitation of previous attempts to use Earth Field NMR was the difficulty of removing the ever-present higher harmonics of the 60 Hz and 50 Hz powerline background. The higher harmonics of the 66 Hz AC signal from the telephone network is also a major background. The harmonics are easily detectable up to 300th order, corresponding to a frequency of about 20 kHz. At 2 kHz for example, the 33rd harmonic of the 60 Hz powerline AC is usually about 80 dB above detector background in an industrial environment.

Only in very remote areas of the country, far away from any power lines, is the background low enough to allow a simple signal detection without the use of modern data analysis. Luckily, the high harmonics of the powerline and telephone system background is quite stable in phase and varies only slowly, concentrating the signal in narrow peaks after FFT analysis. The peaks are narrow enough to provide background free signal areas between the background. The "clean" data windows cover about 80% of the frequency spectrum, interrupted by about 3 Hz wide noise peaks every 60 and 66 Hz. (In some countries, the powerline harmonic peaks are a multiples of other frequencies).

Since the spin relaxation time of the protons in oil is rather short, it results in a broadening of the NMR signal peak. A narrow peak could be covered and hidden by a background signal, but a wider peak, typically 5 to 300 Hz wide, is always visible between the background peaks. The frequency of the proton NMR response is determined by the local earth field and cannot be chosen by the user. One has to live with the given frequency, which varies from location to location.

The typical method to improve a NMR signal is to add up ("stack") many individual NMR excitations. If one keeps the excitation phase corelated over many cycles, and FFT analyzes the spectra in a phase coherent way, the background lines become concentrated in a narrow frequency band, allowing the signal to show up in the clean spaces between.

This method of data taking requires to keep the FFT system running through the excitation cycle, a time where the signal from the receiver has to be blanked out.

A special data analysis allows the inclusion of such blanked out times in the FFT analysis, without degrading the signal.

Since the signal strength is exponentially declining between every excitation, a simple FFT analysis would not extract all the information from the available data.

The recently developed "Joint Time Fourier Analysis" (JTFA) which, for example, is commercially available as Part No. 776733-01 from National Instruments, can extract the full information from the data stream, allowing a very high sensitivity.

This phase preserving data taking and analysis method described here allows the use of Earth Field NMR even in "industrial environments," where there is a large background from powerlines and other sources. This background is very much reduced in deep boreholes, but still present. In shallow boreholes, like in surface arrays, the powerline background can be very high, since most oil fields have powerlines.

To extract information useful for mapping an oil deposit, the phase of the returned NMR signal reative to the transmitter phase is an important parameter. JTFA analysis gives the full phase information of the NMR signal.

A map of the oil or water formation is created by slowly increasing the strength and/or time of the NMR excitation, thus varying the distance from the borehole at which nuclei are spin-flipped by 90 degree. Unfolding the response strength and phase from different excitations gives the location of the oil/water bearing formation. The linear unfolding method is well described in the above referenced British patent GB2198540. The 3-dimensional unfolding is based on the same principal, but requires significantly more computer power.

The use of phased arrays in several boreholes and/or the use of several receivers/transmitters in a single borehole can enhance the capability of the mapping operation.

It has thus been shown that the present invention enables the use of earth field spin echo NMR to search for underground liquid mineral deposits. The invention provides an instrument for measuring the spatial, qualitative and quantitative parameters of an underground NMR active liquid mineral deposit. The instrument may consist of a phased array of excitation and receiver antennas on the ground surface, or excitation and receiver coils located downhole, or a combination, whereby the NMR active nuclei in an underground deposit are excited, and by using known techniques from MRI, the spatial and quantitative distribution of the NMR active nuclei can be measured. The instrument embodiments may be used for tomography of underground water distribution or to map potential contamination sites, as well as for oil and ground water exploration. In addition, the downhole instrument is particularly applicable for an oil reservoir adjacent a borehole up to at least 50 meters around the borehole, which will enable greater extraction efficiency and determine the needed number of production wells.

While particular embodiments have been described and illustrated, along with materials, parameters, etc., to exemplify and teach the principles of the invention, such are not intended to be limiting. Modifications and changes may become apparent to those skilled in the art, and it is intended that the invention be limited only by the scope of the appended claims.

What is claimed is:

1. An instrument for measuring parameters of an underground NMR active liquid mineral deposit, including:

a phased array of excitation and receiver means comprising at least one set of excitation and receiver means for exciting the NMR active nuclei in the deposit, said at least one set of excitation and receiver means being positioned at a location selected from the group consisting of on the ground, in a borehole in the earth, and a combination of ground surface and borehole, and magnetic resonance imaging means for measuring the spatial and quantitative distribution of the NMR active nuclei in the deposit.

2. The instrument of claim 1, wherein said at least one set of excitation and receiver means comprises at least one excitation antenna and at least one receiver antenna positioned on an earth surface.

3. The instrument of claim 1, wherein said at least one set of excitation and receiver means includes at least one excitation antenna located on the ground surface, and at least one receiver means located in a borehole in the earth.

4. The instrument of claim 1, wherein said at least one set of excitation and receiver means is located in a borehole in the earth.

5. The instrument of claim 4, additionally including at least another set of excitation and receiver means located in a borehole in spaced relation to said at least one set of excitation and receiver means.

6. The instrument of claim 5, wherein said sets of excitation and receiver means each have an excitation coil and a receiver coil, said excitation coils having a length of about 10 meters and a diameter of about 5.5 inches, said receiver coils having a length of about 1 meter, said sets being spaced from one another by a distance of about 10 meters.

7. The instrument of claim 6, wherein each said excitation coil has a 100,000 ampere-winding per meter, and wherein each said receiver coil has a 50,000 turn winding.

8. The instrument of claim 6, wherein each of said excitation coil and said receiver coils have a mu-metal core.

9. The instrument of claim 4, additionally including means for cooling said at least one set of excitation and receiving means.

10. The instrument of claim 4, wherein said at least one set of excitation and receiving means includes an excitation coil and a receiver coil.

11. The instrument of claim 1, wherein said phased array of excitation and receiver means comprises antennas located on the ground surface.

12. The instrument of claim 11, wherein in said phased array of excitation and receiver antennas includes a plurality of wire loops positioned on the ground in spaced relation, and means for supplying electrical current to at least one of the said wire loops.

13. The instrument of claim 12, wherein said means for supplying electrical current includes a power supply selected from the group of alternating current and direct current power supplies.

14. The instrument of claim 12, wherein said plurality of spaced wire loops comprise phased array of four 50–500 meter radius loops.

15. The instrument of claim 13, wherein an alternating current is directed into at least one of said wire loops to generate a gradient field in the ground at an angle to a magnetic field of the earth.

16. The instrument of claim 15, wherein said alternating current is a 1000 ampere current at 1500 to 2500 Hz.

17. The instrument of claim 15, wherein a direct current is also directed into at least one of said wire loops for a duration of a few seconds to generate an addition gradient field, superimposed to the earth magnetic field, for enhancing the position sensitivity of the spin-echo.

18. A method using earth field spin echo NMR to locate underground liquid minerals, comprising:

providing excitation means for producing at least an alternating current field in the earth for exciting NMR active nuclei in the liquid minerals, providing a phased array receiver means for receiving signals from the excited NMR active nuclei, and measuring the distribution of the NMR active nuclei using MRI techniques.

19. The method of claim 18, wherein providing the excitation means and the receiver means is carried out by positioning wire loops comprising each of said excitation and receiver means in spaced relation on an earth surface over the liquid minerals.

20. The method of claim 18, wherein providing the excitation means and the receiver means is carried out by positioning at least one excitation coil and at least one receiver coil in a borehole through or adjacent to the liquid minerals.

21. A method of claim 18, wherein the enhancement of the the signal/background ratio utilizes phase coherent FFT analysis and Joint Time Fourier analysis.

22. The method of claim 21, whereby a 5000 times weaker signal, compared to hydrogen, can be directly detected from carbon-13 in oil, thus providing the capability to detect a liquid such as oil from the surface or in the vicinity of a borehole.

* * * * *